(12) United States Patent
Zarate et al.

(10) Patent No.: US 7,259,601 B2
(45) Date of Patent: *Aug. 21, 2007

(54) APPARATUS AND METHOD FOR SUPPRESSING JITTER WITHIN A CLOCK SIGNAL GENERATOR

(75) Inventors: Oliver F. Zarate, Boise, ID (US); Tyler J. Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/216,416

(22) Filed: Aug. 30, 2005

(65) Prior Publication Data

US 2005/0285644 A1 Dec. 29, 2005

Related U.S. Application Data

(63) Continuation of application No. 10/668,755, filed on Sep. 23, 2003, now Pat. No. 6,937,077.

(51) Int. Cl.
*H03L 7/06* (2006.01)

(52) U.S. Cl. ............ 327/158; 327/159; 327/161; 331/11

(58) Field of Classification Search ........... None
See application file for complete search history.

(56) References Cited

U.S. PATENT DOCUMENTS

| 4,805,021 | A | 2/1989 | Harlos et al. |
|---|---|---|---|
| 5,781,054 | A | 7/1998 | Lee |
| 5,889,435 | A | 3/1999 | Smith et al. |
| 5,923,715 | A | 7/1999 | Ono |
| 6,037,812 | A | 3/2000 | Gaudet |
| 6,087,868 | A | 7/2000 | Millar |
| 6,137,328 | A | 10/2000 | Sung |
| 6,215,726 | B1 | 4/2001 | Kubo |
| 6,222,895 | B1 | 4/2001 | Larsson |
| 6,259,288 | B1 | 7/2001 | Nishimura |
| 6,292,040 | B1 | 9/2001 | Iwamoto et al. |
| 6,337,590 | B1 | 1/2002 | Millar |
| 6,359,487 | B1 | 3/2002 | Heightley et al. |
| 6,373,913 | B1 | 4/2002 | Lee |
| 6,437,619 | B2 | 8/2002 | Okuda et al. |
| 6,489,823 | B2 | 12/2002 | Iwamoto |
| 6,522,122 | B2 | 2/2003 | Watanabe et al. |
| 6,937,077 | B2 | 8/2005 | Zarate et al. |
| 7,095,261 | B2 * | 8/2006 | Drexler et al. ............ 327/158 |

* cited by examiner

*Primary Examiner*—Kenneth B. Wells
*Assistant Examiner*—An T. Luu
(74) *Attorney, Agent, or Firm*—Schwegman, Lundberg, Woessner & Kluth, P.A.

(57) ABSTRACT

A clock synchronization circuit (200, FIG. 2) includes a signal selector (202), phase detector (204), and delay line (206). The signal selector compares an external clock signal (220) and a feedback signal (222) to evaluate the jitter present in the external clock signal. When the jitter falls within an acceptable range, the circuit operates in DLL mode. In DLL mode, the external clock signal is provided to the delay line, and the delayed external signal is output (224) from the circuit. If the jitter falls outside the acceptable range and the circuit is locked, the circuit is switched to PLL mode. In PLL mode, a clock signal based on the feedback signal is provided to the delay line, and the delayed feedback signal is output from the circuit. The PLL mode is only allowed to operate briefly before switching the circuit back into DLL mode.

24 Claims, 9 Drawing Sheets

APPARATUS AND METHOD FOR SUPPRESSING JITTER WITHIN A CLOCK SIGNAL GENERATOR

This application is a Continuation of U.S. application Ser. No. 10/668,755, filed Sep. 23, 2003, now U.S. Pat. No. 6,937,077, which is incorporated herein by reference.

TECHNICAL FIELD

The present invention relates to clock signal generators suitable for use in an integrated circuit device. More particularly, the present invention relates to an internal clock signal generator in a memory device, which suppresses jitter present in an external clock signal while generating a synchronized internal clock.

BACKGROUND

High-speed data transfer between a synchronous memory device and a memory controller involves the use of synchronized clock signals. For a read operation, the memory device receives an external clock signal (e.g., from the controller), and supplies data in synchronization with the external clock signal. To synchronize data transfer, the memory device generates an internal clock signal based on the external clock signal. This internal clock signal controls the data output.

A clock signal generator, which functions as a clock synchronization circuit, is provided within the memory device to generate the internal clock signal in synchronization with the external clock signal. Various phase locked loop (PLL) and delay locked loop (DLL) circuits have been implemented in clock synchronization circuits, in order to generate the internal clock signal.

A PLL circuit includes a feedback loop in which the frequency and phase of the internal clock signal, which is produced by a variable oscillator, is locked to that of the external clock signal. A basic PLL circuit includes a phase comparator and a voltage controlled oscillator (VCO). In operation, the phase comparator compares a modulated version of the external clock signal with the output of the VCO (i.e., the internal clock signal), and the output of the phase comparator controls the oscillation frequency of the VCO. A drawback to the conventional PLL circuit is that, after the PLL circuit is locked (i.e., the internal clock signal is synchronized with the external clock signal), even a slight jitter (i.e., phase fluctuation) in the external clock signal is propagated through to the internal clock signal.

Digital DLL circuits are commonly used and are easily implemented in digital systems. A digital DLL circuit includes a digitally adjustable delay line. Digital information is used to either include or exclude a certain number of delay elements within a delay chain. As with a PLL, a digital DLL circuit propagates jitter in the external clock signal through to the internal clock signal. Another disadvantage to a digital DLL circuit is that, by virtue of its design, it also introduces an additional amount of jitter into the internal clock signal.

Jitter is characterized by on-time-base fluctuations in one or both of the rise and fall of a clock signal. Jitter present in the external clock signal is a phenomenon that occurs due to substrate noise (e.g., power rail noise and crosstalk). Although efforts are made to reduce the external clock signal jitter (e.g., by increasing shielding and power bus isolation), a dynamic amount of jitter continues to exist within the external clock signal. As discussed above, using prior art clock synchronization circuits, this jitter is propagated through and in some cases exacerbated by the clock synchronization circuit. Jitter affects the time when data is made available by the memory device to the memory controller, effectively reducing the data eye (i.e., the effective width of the valid data window). Thus, when too much clock jitter is present, it can cause failures during read operations.

External clock signal jitter affects the ability to reliably increase memory controller speeds; Current system designs factor in a prediction that a certain amount of jitter will be present in the external and internal clock signals. This jitter causes the data eye for a read operation to dynamically shift, effectively reducing its width. When controller speeds are increased, the data eye is even further reduced, thus becoming less and less tolerable to external clock signal jitter. Accordingly, what are needed are methods and apparatus for suppressing the effect of the external clock signal jitter in producing a synchronized clock signal.

SUMMARY

In one embodiment, an apparatus includes a signal selector circuit, a delay line, and a feedback loop. The signal selector circuit switches between providing an external clock signal or a feedback clock signal as an input clock signal to the delay line. The delay line receives the input clock signal and generates an internal clock signal. The feedback loop, which exists between an output of the delay line and an input of the signal selector circuit, produces the feedback clock signal from the input clock signal.

In another embodiment, an apparatus includes a delay line, a feedback loop, a phase detector, a shift register, and a signal selector circuit. The delay line receives an input clock signal and generates an internal clock signal. The feedback loop produces a feedback clock signal from the input clock signal. The phase detector determines a phase difference between the input clock signal and the feedback clock signal, and produces a control signal. The shift register receives the control signal and controls the delay line correspondingly. The signal selector circuit switches between a delay locked loop mode and a phase locked loop mode. In the delay locked loop mode, the signal selector circuit provides an external clock signal as the input clock signal to the delay line. In the phase locked loop mode, the signal selector circuit provides the feedback clock signal as the input clock signal to the delay line.

In still another embodiment, an apparatus includes a signal selector means, a delay means, and a feedback means. The signal selector means provides an input clock signal to the delay means. The signal selector means switches between providing an external clock signal or a feedback clock signal as the input clock signal. The delay means receives the input clock signal and generates an internal clock signal. The feedback means exists between the delay means and the signal selector means. The feedback means produces the feedback clock signal from the input clock signal.

In still another embodiment, an apparatus includes a signal selector means, a delay means, and a feedback means. The signal selector means provides an input clock signal to the delay means. The signal selector means selectively switches between providing an external clock signal or a feedback clock signal as the input clock signal. The signal selector means provides the feedback clock signal as the input clock signal when a jitter in the external clock signal does not fall within an acceptable range of jitter values. The delay means receives the input clock signal and generates an internal clock signal. The feedback means exists between the delay means and the signal selector means. The feedback means receives the input clock signal and generates the feedback clock signal.

In still another embodiment, a clock synchronization circuit includes a signal selector circuit, a delay line, and a feedback loop. The signal selector circuit switches between providing an external clock signal or a feedback clock signal as an input clock signal to the delay line. The delay line receives the input clock signal and generates an internal clock signal. The feedback loop exists between an output of the delay line and an input of the signal selector circuit. The feedback loop produces the feedback clock signal from the input clock signal.

In still another embodiment, an integrated circuit device includes a substrate and an integrated circuit supported by the substrate. The integrated circuit includes a signal selector circuit, a delay line, and a feedback loop. The signal selector circuit switches between providing an external clock signal or a feedback clock signal as an input clock signal to the delay line. The delay line receives the input clock signal and generates an internal clock signal. The feedback loop exists between an output of the delay line and an input of the signal selector circuit. The feedback loop produces the feedback clock signal from the input clock signal.

In still another embodiment, an integrated circuit device includes a substrate and an integrated circuit supported by the substrate. During operation, the integrated circuit performs a method that includes receiving an external clock signal and providing the external clock signal to a delay line. The delay line produces the internal clock signal. The method also includes providing a feedback clock signal from the internal clock signal, and comparing the external clock signal with the feedback clock signal to determine whether the external clock signal or the feedback signal is provided to the delay line. The determination is based on whether a jitter in the external clock signal falls within an acceptable range of jitter values. If the jitter does not fall within the acceptable range, the feedback clock signal is provided to the delay line rather than providing the external clock signal to the delay line.

In still another embodiment, an integrated memory circuit includes a substrate, a plurality of memory cells supported by the substrate, and an integrated circuit supported by the substrate. The integrated circuit includes a signal selector circuit, a delay line, and a feedback loop. The signal selector circuit switches between providing an external clock signal or a feedback clock signal as an input clock signal to the delay line. The delay line receives the input clock signal and generates an internal clock signal. The feedback loop exists between an output of the delay line and an input of the signal selector circuit. The feedback loop produces the feedback clock signal from the input clock signal.

In still another embodiment, a semiconductor die includes a substrate and an integrated circuit supported by the substrate. The integrated circuit includes a signal selector circuit, a delay line, and a feedback loop. The signal selector circuit switches between providing an external clock signal or a feedback clock signal as an input clock signal to the delay line. The delay line receives the input clock signal and generates an internal clock signal. The feedback loop exists between an output of the delay line and an input of the signal selector circuit. The feedback loop produces the feedback clock signal from the input clock signal.

In still another embodiment, an electronic system includes a memory controller and an integrated memory circuit. The integrated memory circuit includes a plurality of memory cells and an integrated circuit. The integrated circuit includes a signal selector circuit, a delay line, and a feedback loop. The signal selector circuit switches between providing an external clock signal or a feedback clock signal as an input clock signal to the delay line. The delay line receives the input clock signal and generates an internal clock signal. The feedback loop exists between an output of the delay line and an input of the signal selector circuit. The feedback loop produces the feedback clock signal from the input clock signal.

In still another embodiment, an electronic system includes a source of an external clock signal and an integrated memory circuit. The integrated memory circuit includes a signal selector circuit, a delay line, and a feedback loop. The signal selector circuit switches between providing an external clock signal or a feedback clock signal as an input clock signal to the delay line. The delay line receives the input clock signal and generates an internal clock signal. The feedback loop exists between an output of the delay line and an input of the signal selector circuit. The feedback loop produces the feedback clock signal from the input clock signal.

In still another embodiment, a method for generating an output clock signal receives a first clock signal and determines if a jitter in the first clock signal is within an acceptable range of jitter values. If the jitter is within the acceptable range, the first clock signal is delayed to produce the output clock signal. If the jitter is not within the acceptable range, a second clock signal is delayed to produce the output clock signal.

In still another embodiment, a method for generating an internal clock signal receives an external clock signal and a feedback clock signal. The feedback signal is derived from the internal clock signal. The method determines whether a jitter in the first clock signal falls within an acceptable range of jitter values. If the jitter falls within the acceptable range, the external clock signal is delayed to produce the internal clock signal and the feedback clock signal. If the jitter does not fall within the acceptable range, the feedback clock signal is delayed to produce the internal clock signal and the feedback clock signal.

In still another embodiment, a method for generating an internal clock signal receives an external clock signal and provides the external clock signal to a delay line. The delay line produces the internal clock signal. The method provides a feedback clock signal from the internal clock signal. The method further compares the external clock signal with the feedback clock signal to determine whether the external clock signal or the feedback signal is provided to the delay line. The determination is based on whether a jitter in the external clock signal falls within an acceptable range of jitter values. If the jitter does not fall within the acceptable range, the feedback clock signal is provided to the delay line rather than providing the external clock signal to the delay line.

DESCRIPTION OF THE EMBODIMENTS

In the following description of the embodiments, reference is made to the accompanying drawings, which form a part hereof and show, by way of illustration, specific embodiments in which the invention may be practiced. These embodiments are described in sufficient detail to enable those skilled in the art to practice the invention, and it is to be understood that other embodiments may be utilized, and that process or mechanical changes may be made, without departing from the scope of the present invention. It will be recognized that the methods of the various embodiments can be combined in practice, either concurrently or in succession. Various permutations and combinations will be readily apparent to those skilled in the art.

The various embodiments of the invention involve new and novel methods and apparatus for achieving suppression of the phase fluctuations (i.e., jitter) of an input clock signal in conjunction with producing a synchronized output clock signal. The embodiments of the invention have several significant advantages over prior art methods. First, the embodiments of the invention enable unacceptably high jitter in the input clock signal to be selectively suppressed, thus reducing the likelihood that such jitter may cause a system failure (e.g., a read failure) or performance degradation. Further, the embodiments of the invention provide improved jitter suppression, without requiring additional devices and without a significant cost increase.

Figure 1:
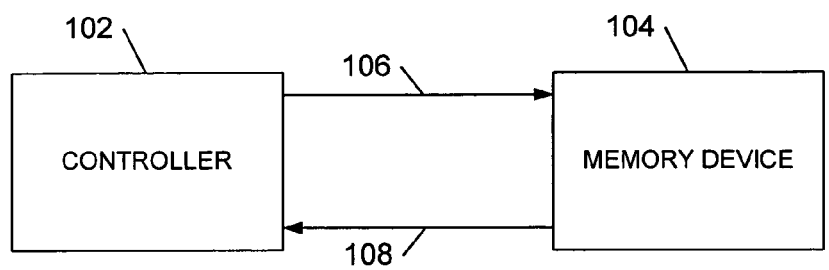
FIG. 1 illustrates a simplified block diagram of a controller and a memory device, in accordance with an embodiment of the invention.

FIG. 1 illustrates a simplified block diagram of a memory controller 102 and a memory device 104, in accordance with an embodiment of the invention. Controller 102 can be a logic element within a processor. Alternatively, controller 102 can be integrated with another type of integrated circuit, or it can be a stand-alone device.

Controller 102 makes various requests to write data to memory device 104, and to read data from memory device 104. Controller 102 also provides an external clock signal 106 to memory device 104. During a read operation, memory device 104 uses the external clock signal 106 to generate a synchronized internal clock signal, which is fed back to the controller 102 in the form of an echo clock signal 108 or data strobe. In addition, the synchronized internal clock signal is used to align the memory data with the external reference clock, in one embodiment. The memory device 104 includes a clock synchronization circuit, described in detail below, to generate the internal clock signal from the external clock signal 106. The controller 102 uses the echo clock signal 108 to determine when to read data from an output buffer of the memory device 104.

In one embodiment, the clock synchronization circuit is located within the same device as the integrated circuit that sends out and/or consumes the internal clock signal. For example, in a system such as that depicted in FIG. 1, the clock synchronization circuit is located within memory device 104 (e.g., a synchronous DRAM or other type of memory device). In other embodiments, the clock synchronization circuit can be located externally from the memory device. For example, the clock synchronization circuit can be located in controller 102, in a hub (not shown), or in another external circuit. In still other embodiments, the clock synchronization circuit can be used in applications other than memory read applications.

In one embodiment, the clock synchronization circuit includes a DLL circuit with a feedback loop. The circuit operates in a "DLL mode" when the external clock signal jitter falls within an acceptable range of jitter values. In this mode, the external clock signal is subject to a variable delay, but is otherwise propagated through to the output of the circuit. Accordingly, any jitter that exists in the external clock signal also is propagated to the internal clock signal produced by the clock synchronization circuit.

When the external clock signal jitter does not fall within the acceptable range of values, the clock synchronization circuit initiates a transition to operating in a "PLL mode". In this mode, the circuit ceases to operate in a DLL manner, where the external clock signal is propagated through the circuit. Instead, after ensuring that the DLL circuit is locked, the circuit switches to PLL operation. While the clock synchronization circuit is in PLL mode, the jitter on the external clock signal is not propagated through to the clock synchronization circuit output, and thus the jitter in the external clock signal is effectively suppressed. In one embodiment, the clock synchronization circuit remains in the PLL mode only until another switching condition occurs, such as the external clock signal jitter converging back into the acceptable range of values, or the expiration of a relatively short timeout period.

Figure 2:
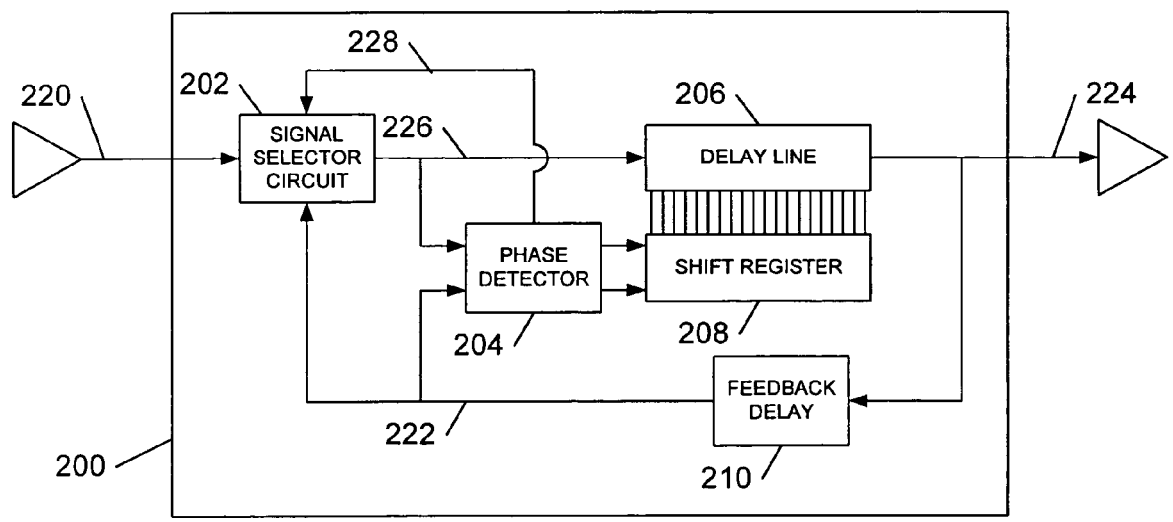
FIG. 2 illustrates a simplified block diagram of a clock synchronization circuit, in accordance with an embodiment of the invention.

FIG. 2 illustrates a simplified block diagram of a clock synchronization circuit 200, in accordance with an embodiment of the invention. The clock synchronization circuit 200 operates as a DLL circuit and a PLL circuit. In one embodiment, the clock synchronization circuit 200 includes a signal selector circuit 202, a phase detector 204, a delay line 206, a shift register 208, and a feedback delay circuit 210.

The DLL portion of the clock synchronization circuit 200 includes phase detector 204, shift register 208, delay line 206, and delay circuit 210. In DLL mode, the external clock signal 220 is evaluated by signal selector circuit 202, and passed through to delay line 206. Delay line 206 includes a fine adjustment delay line and a coarse adjustment delay line (not shown), in one embodiment. Delay line 206 delays the signal received from signal selector circuit 202, and outputs an internal clock signal 224. This signal is also fed back to and delayed by feedback delay circuit 210, the output of which is provided to phase detector 204. Phase detector 204 compares the phases of the external clock signal 226 with a feedback clock signal 222 produced by delay circuit 210. Phase detector 204 then outputs control signals (e.g., UP, DOWN, and LOCK) to shift register 208, which is a delay controller means. Shift register 208 adjusts the delay imposed by delay line 206, accordingly, in order to synchronize the external clock signal 220 with the internal clock signal 224.

When in DLL mode, circuit 200 operates as a delay adjustment circuit. This means that the external clock signal 220 is used as the basis for providing the clock signal 226 to the delay line 206. In this mode, the feedback signal 222 is primarily used to affect the delay imposed by delay line 206.

The PLL portion of the clock synchronization circuit 200 also includes phase detector 204, shift register 208, delay line 206, and feedback delay circuit 210. In PLL mode, the circuit operates much the same as described in the previous paragraphs. However, in PLL mode, the circuit 200 operates as a clock generation circuit. In other words, the feedback signal 222 is used as the basis for providing the clock signal 226 to the delay line 206, rather than using the external clock signal 220 as the basis.

Signal selector circuit 202 is responsible for switching between DLL and PLL modes, in one embodiment. Signal selector circuit 202 receives the external clock signal 220 and the feedback signal 222. Based on these inputs, signal selector circuit 202 determines whether the external clock signal 220 is experiencing jitter that falls within a range of acceptable jitter values. In other words, for each clock cycle, signal selector circuit 202 determines whether an edge of the external clock signal 220 occurs within a "jitter window," which surrounds the expected time that the edge should occur. In one embodiment, the edge used for the determination is the rising clock edge. In another embodiment, the falling clock edge is used. In yet another embodiment, both rising and falling edges are used as in a Double Data Rate device. In still another embodiment, signal selector circuit 202 makes this determination more or less frequently than once per clock cycle.

Figure 3:
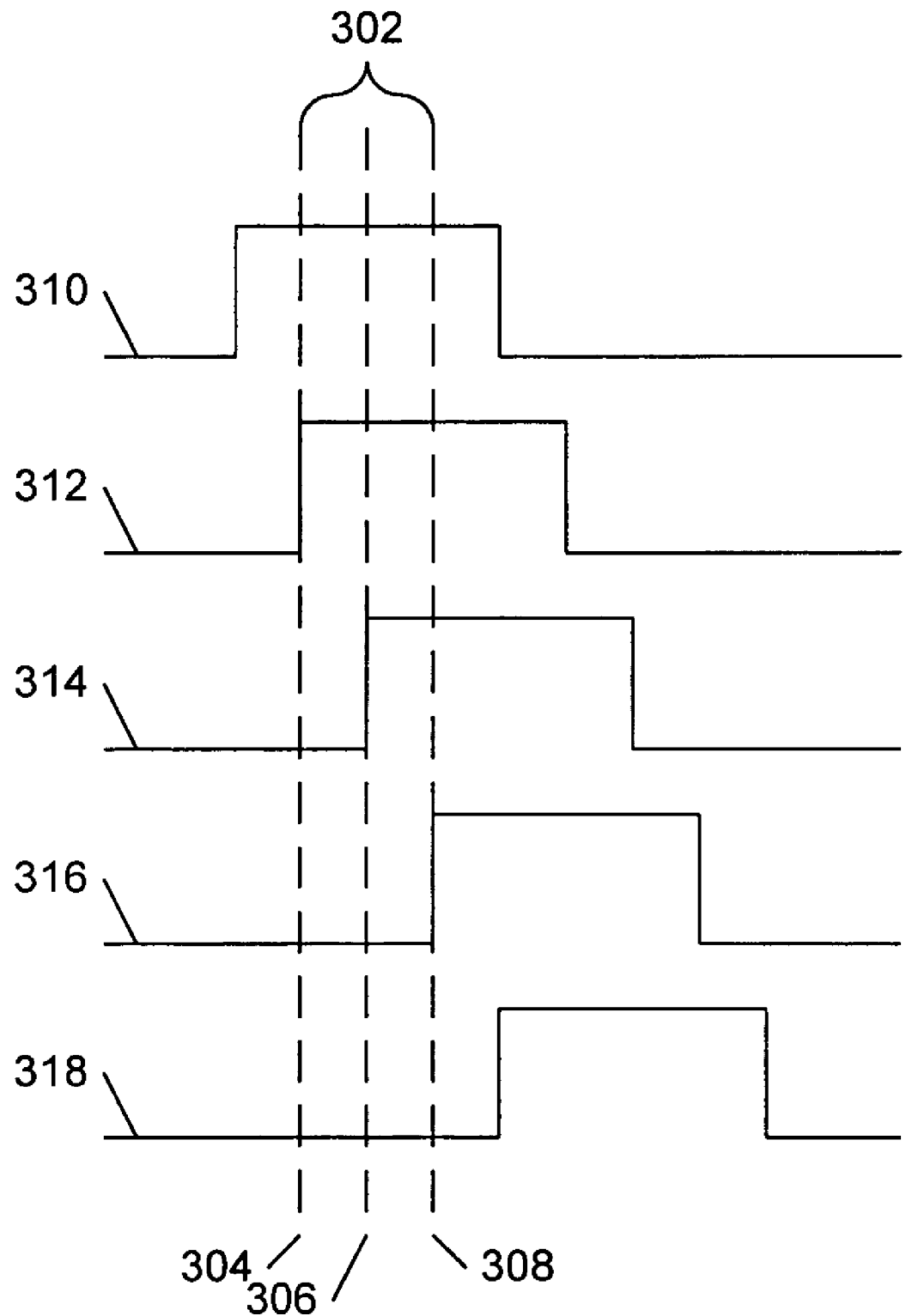
FIG. 3 illustrates a timing diagram, which depicts the concept of a jitter window, in accordance with an embodiment of the invention.

FIG. 3 illustrates a timing diagram, which depicts the concept of the jitter window, in accordance with an embodiment of the invention. The jitter window 302 defines the range of acceptable jitter values. In one embodiment, the jitter window 302 is a time slice, which straddles a time 306 when a clock edge of the external clock signal is expected to occur. In one embodiment, the jitter window is defined by an early boundary 304, which occurs before the expected edge time 306, and a late boundary 308, which occurs after the expected edge time 306. Example signals 310, 312, 314, 316, and 318 represent signals with clock edges that occur before the early boundary, at the early boundary 304, at the expected edge time 306, at the late boundary 308, and after the late boundary, respectively.

In one embodiment, the jitter window has a width equal to 2*td, where td is referred to herein as the deviation threshold. In one embodiment, td is equal to the width of one fine delay element of delay line 206 (FIG. 2). In other embodiments, td can have larger or smaller values, or the jitter window can have a width of a multiple of td that is greater than 2 (e.g., 3*td, 4*td, etc.), depending on how much jitter is tolerable. The magnitude of the jitter, for any given clock cycle, can be calculated as the absolute value of the time difference between the expected edge time and the actual edge time of the external clock signal 220. If the magnitude of the jitter is greater than the deviation threshold, td, then the external clock signal edge has occurred outside the jitter window 302. In other embodiments, different mathematical calculations can be performed to determine whether the jitter falls within an acceptable range.

Referring also to FIG. 2, if the external clock signal edge occurs within the jitter window 302 (e.g., signals 312, 314, or 316), then the clock synchronization circuit 200 operates in the DLL mode. In this mode, the external clock signal 220 is passed through to the output 226 of signal selector 202. This output clock signal 226 is then fed through delay line 206, which applies a variable delay to signal 226 based on the value in shift register 208. The value in shift register 208 is based on a phase differential, which phase detector 204 detects between the clock signal at the output 226 of signal selector 202 and the internal clock signal produced at the output 224 of the clock synchronization circuit 200. Ultimately, in this DLL mode, the delayed external clock signal is produced as the output 224 of the clock synchronization circuit 200.

If the external clock signal edge does not occur within the jitter window 302 (e.g., signals 310 or 318), then a transition to the PLL mode is initiated. In one embodiment, the transition only occurs when the DLL path is locked (i.e., the output clock signal 224 is synchronized with the external clock signal 226). Phase detector circuit 204 receives signals 222 and 226, and determines when the DLL path is locked. When it is locked, phase detector circuit 204 provides a signal to signal selector 202 over control line 228, which indicates that a DLL-to-PLL mode switch is permitted to occur.

When signal selector 202 has determined that the external clock signal edge has occurred outside the jitter window 302, and the control signal 228 indicates that the DLL path is locked, signal selector 202 switches to PLL mode by routing a clock signal based on the feedback signal 222 to the output 226 of signal selector 202, rather than routing the external clock signal 220 to the output 226. In one embodiment, signal selector 202 chooses between an early feedback clock signal and a late feedback clock signal, both of which are based on the feedback clock signal 222.

The early feedback clock signal has a clock edge that occurs approximately at the early boundary 304 of the jitter window 302. The early feedback clock signal is chosen when the external clock signal edge occurred before the early boundary (e.g., as is the case with signal 310). The late feedback clock signal has a clock edge that occurs approximately at the late boundary 308 of the jitter window 302. The late feedback clock signal is chosen when the external clock signal edge occurred after the late boundary (e.g., as is the case with signal 318).

In another embodiment, only one feedback signal is available for selection, regardless of whether the external clock edge occurred before or after the jitter window boundaries. In this embodiment, the clock edge of the feedback signal can occur at approximately the center of the jitter window 302. In still other alternate embodiments, more than two feedback signals can be selected from.

The clock synchronization circuit 200 is allowed to operate in the PLL mode, in one embodiment, until the signal selector 202 determines that the external clock signal edge has shifted back into the jitter window 302, or until another switching condition (e.g., expiration of a timeout period) occurs, whichever happens sooner. The PLL mode feedback signal has at least one clock edge that occurs within the jitter window 302 (i.e., at least the first clock edge), and thus the magnitude of the signal selector output signal 226 jitter is less than it would be if the external clock signal 220 were passed through the signal selector 202. However, because the PLL mode is a closed loop process that is not affected by the external clock signal, the feedback signal is subject to drifting away from the phase of the external clock signal. If allowed to drift too far, the system's operation can be detrimentally affected.

Accordingly, the clock synchronization circuit 200 is not allowed to remain in the PLL mode indefinitely. Instead, the circuit switches back to DLL mode operations when a switching condition occurs. In one embodiment, the switching condition is the expiration of a timeout period. The timeout period is an amount of time that the circuit is allowed to remain in the PLL mode, in one embodiment. The timeout period can be, for example, in a range of 3-5 clock cycles. In other embodiments, the timeout period can be longer or shorter. In still other embodiments, transition back to the DLL mode can be initiated based on other time-based or non-time-based switching conditions. For example, a switching condition can be based on a measured phenomenon (e.g., a comparison of the phase difference between the external clock and the feedback clock) or on some other triggering event (e.g., an indication of a read failure). By allowing the PLL mode only for relatively short intervals, the circuit is more likely to be able to maintain correct clock synchronization.

In one embodiment, phase detector 204 includes a means for determining whether the timeout period has expired. When that occurs, phase detector 204 indicates to signal selector 202, via control line 228, that a PLL-to-DLL mode switch should occur. In another embodiment, the control signal can originate from a source other than phase detector 204. When signal selector 202 receives the switch signal, signal selector 202 switches back to DLL mode, thus routing the external clock signal 220 to the output 226 of the signal selector 202, rather than providing a clock signal based on the feedback clock 222. Accordingly, the circuit returns to delay mode operation.

Figure 4:
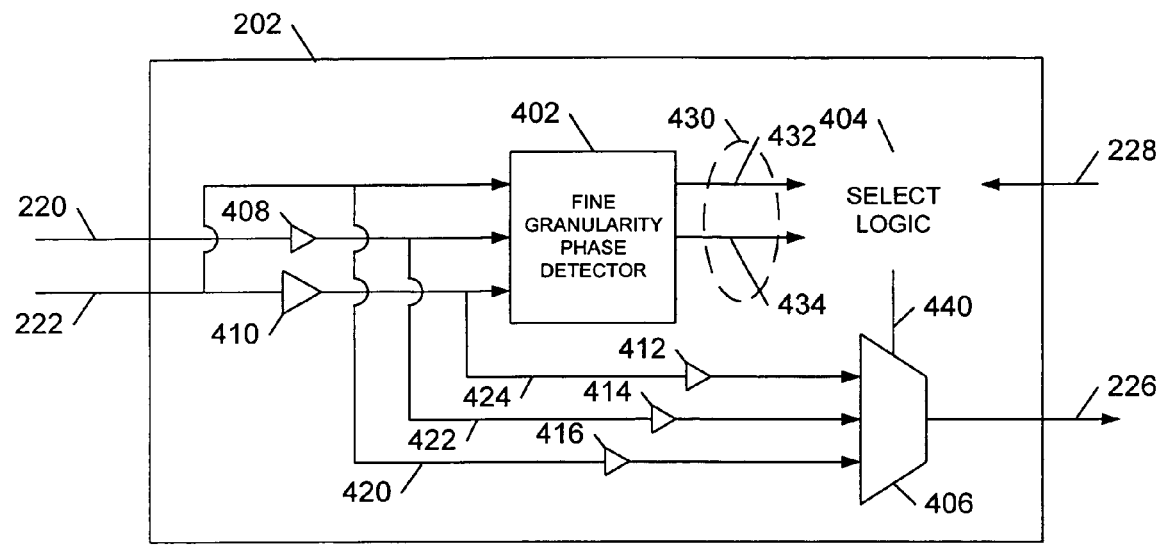
FIG. 4 illustrates a simplified block diagram of a signal selector circuit, in accordance with an embodiment of the invention.

The signal selector circuit 202 depicted in FIG. 2 is now discussed in more detail, in describing various embodiments of the invention. FIG. 4 illustrates a simplified block diagram of a signal selector circuit 202, in accordance with an embodiment of the invention. In one embodiment, signal selector circuit 202 includes a fine granularity phase detector 402, select logic 404, a multiplexer 406, and various delay elements 408, 410, 412, 414, 416. Signal selector circuit 202 receives the external clock signal 220 and the feedback clock signal 222. The feedback clock signal 222 indicates the expected location of the edge of the external clock signal 220. Signal selector circuit 202 includes a jitter detection means, which detects the amount of jitter present in the external clock signal 220. Signal selector circuit 202 also includes a switching means, responsive to the jitter detection means, which produces an output clock signal 226 having a phase that is altered, if the magnitude of the detected jitter is too large.

In one embodiment, this is accomplished as follows. Three clock signals 420, 422, 424 are input into the fine granularity phase detector 402. The first clock signal 420 is the feedback clock signal 222, unaffected by any delay, in one embodiment. The second clock signal 422 is the external clock signal 220 delayed by a value equal to the deviation threshold, td, in one embodiment. The delay is accomplished using a first delay element 408. Finally, the third clock signal 424 is the feedback clock signal 222 delayed by a value equal to two times the deviation threshold, or 2*td, in one embodiment. The delay is accomplished using a second delay element 410.

The first and third clock signals 420, 424 are used to define the boundaries of the jitter window. Referring also to FIG. 3, the first clock signal 420 corresponds to signal 312, which has an edge that occurs approximately at the early boundary 304 of the jitter window 302. Accordingly, the first clock signal 420 is referred to as the "early clock signal." The third clock signal 424 corresponds to signal 316, which has a clock edge that occurs approximately at the late boundary 308 of the jitter window 302. Accordingly, the third clock signal 424 is referred to as the "late clock signal."

The second clock signal 422 is delayed by the deviation threshold, td, which places the edge of the second clock signal 422 approximately in the center of the jitter window 302, if the external clock signal 220 is experiencing zero jitter with respect to the internal clock signal 222. This condition is illustrated by signal 314 of FIG. 3. If the edge of the external clock signal 220 occurs more than one deviation threshold before the edge of the internal clock signal 222, then the edge of the second clock signal 422 occurs before the edge of the early clock signal 420. This condition is illustrated by signal 310. Similarly, if the edge of the external clock signal 220 occurs more than one deviation threshold after the edge of the internal clock signal 222, then the edge of the second clock signal 422 occurs after the edge of the late clock signal 424. This condition is illustrated by signal 318.

The fine granularity phase detector 402 detects which of the three jitter states the external clock 220 is experiencing. These states are: 1) the external clock edge is occurring before the early boundary 304 of the jitter window 302; 2) the external clock edge is occurring within the jitter window 302; or 3) the external clock edge is occurring after the late boundary 308 of the jitter window 302.

In one embodiment, phase detector 402 outputs a signal 430, which includes two output signal lines 432, 434. Signal 430 enables select logic 404 to control which input clock signal 420, 422 or 424 is passed through to the output 226 of signal selector 202. In other embodiments, the jitter state can be represented by a signal other than a two-bit, parallel binary signal.

Figure 5:
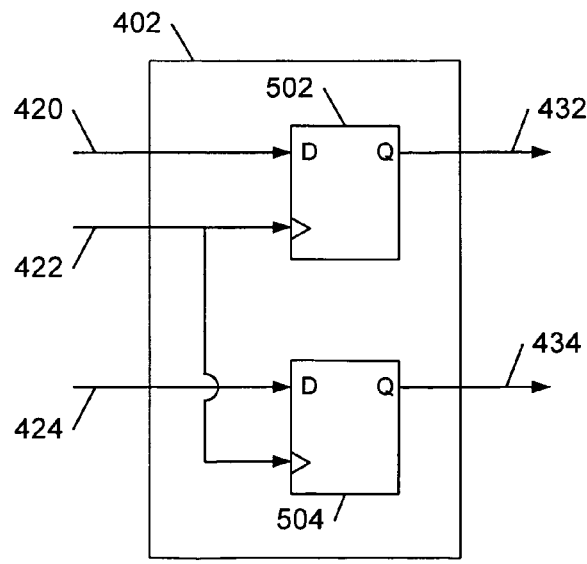
FIG. 5 illustrates a simplified block diagram of a phase detection circuit, in accordance with an embodiment of the invention.

In one embodiment, signal 430 is produced within fine granularity phase detector 402 using a phase detection circuit, such as the circuit illustrated in FIG. 5. FIG. 5 illustrates a simplified block diagram of a phase detection circuit 402, in accordance with an embodiment of the invention.

In one embodiment, phase detection circuit 402 includes two D-type flip-flops 502, 504. The early clock signal 420 is sent to the data input of flip-flop 502, and the late clock signal 424 is sent to the data input of flip-flop 504. The delayed external clock signal 422 is sent to the clock input of both flip-flops 502, 504. When the delayed external clock signal 422 experiences an edge, the states of the early and late clock signals 420, 424 are clocked through flip-flops 502, 504, producing two output signals 432, 434, respectively.

Referring to the example cases depicted in FIG. 3, when the external clock edge occurs before the early boundary 304 of the jitter window 302, as is depicted by signal 310, the early clock signal 420 has a low value when it is clocked through flip-flop 502. Similarly, the late clock signal 424 also has a low value when it is clocked through flip-flop 504. Thus, output signals 432, 434 each have a low value.

When the external clock edge occurs within the jitter window 302, as depicted by signal 314, the early clock signal 420 has a high value and the late clock signal 424 has a low value when they are clocked through flip flops 502 and 504. In this situation, output signal 432 has a high value and output signal 434 has a low value.

When the external clock edge occurs shortly after the late boundary 308 of the jitter window 302, as depicted by signal 318, both the early clock signal 420 and the late clock signal 424 have high values. Thus, output signals 432, 434 each have high values.

In the final case, when the external clock edge occurs after the late boundary 308 and also after the falling edge of the early clock signal 312, 420, then the early clock signal 420 has a low value and the late clock signal 424 has a high value when they are clocked through flip-flops 502, 504. Accordingly, output signal 432 has a low value, and output signal 434 has a high value. In this situation, the external clock jitter is so large, that the clock edge is occurring nearly 180 degrees out of phase from the expected value. This condition can indicate a loss of lock of the DLL circuit.

Referring again to FIG. 4, and as mentioned above, output signals 432, 434 are provided to select logic block 404. Depending on the state of output signals 432, 434, select logic block 404 provides a two-bit binary signal 440 to multiplexer 406. The value of the binary signal 440 indicates to multiplexer 406 which of the three signals 420, 422, 424 multiplexer 406 should provide as the output clock signal 226 of the signal selector circuit 202.

In one embodiment, each of the three signals 420, 422, 424 is subject to a delay, via a set of delay elements 412, 414, 416, prior to being provided to multiplexer 406. This produces a first, second, and third multiplexer input signal. The amount of delay inserted by delay elements 412, 414, 416 is approximately the propagation delay of the signal selection process (i.e., blocks 402, 404), in one embodiment. The amount of delay is selected to increase the likelihood that multiplexer 406 will be properly set before the arrival of the delayed versions of signals 420, 422, 424, in one embodiments. In other embodiments, delay elements 412, 414, 416 are not included in the circuit, or the amount of inserted delay is larger or smaller than the signal selection process propagation delay.

Table 1, below, shows the four possible combinations of the output signals 432, 434, and the course of action that select logic 404 informs multiplexer 406 to take for each possible combination, in accordance with one embodiment:

TABLE 1

Select Logic Decisions Based on Phase Detector Output Signals

| Output Signal 432 | Output Signal 434 | Select Logic Decision |
| --- | --- | --- |
| 0 | 0 | Select early feedback clock 420 |
| 1 | 0 | Select external clock 422 |
| 0 | 1 | Select external clock 422 |
| 1 | 1 | Select late feedback clock 424 |

Select logic 404 sends the control signal 440 to multiplexer 406 to tell multiplexer 406 which clock signal it should provide to the output 226 of the signal selector circuit 202. In one embodiment, since three signals 420, 422, 424 are available, the control signal 440 is a two-bit signal. When multiplexer 406 receives the control signal 440, it provides the corresponding signal to the output 226. Accordingly, a transition from DLL mode to PLL mode occurs when multiplexer 406 switches from providing the delayed external clock signal 422 as the output, to providing a feedback clock signal (e.g., either the early or late clock signal 420, 424) as the output. Similarly, a transition from PLL mod to DLL mode occurs when multiplexer 406 switches from providing a feedback clock signal (e.g., either the early or late clock signal 420, 424) as the output, to providing the delayed external clock signal 422 as the output.

In an alternate embodiment, only a single feedback clock signal is used during the PLL mode. For example, the single feedback clock can have a clock edge that occurs approximately at the center of the jitter window at the time of transition from DLL mode to PLL mode. In such an embodiment, the control signal 440 can be a one-bit signal, since only two options are available to multiplexer 406. In still other embodiments, more than two feedback signals can be available to select from, with each feedback signal being subject to a different delay.

Figure 6:
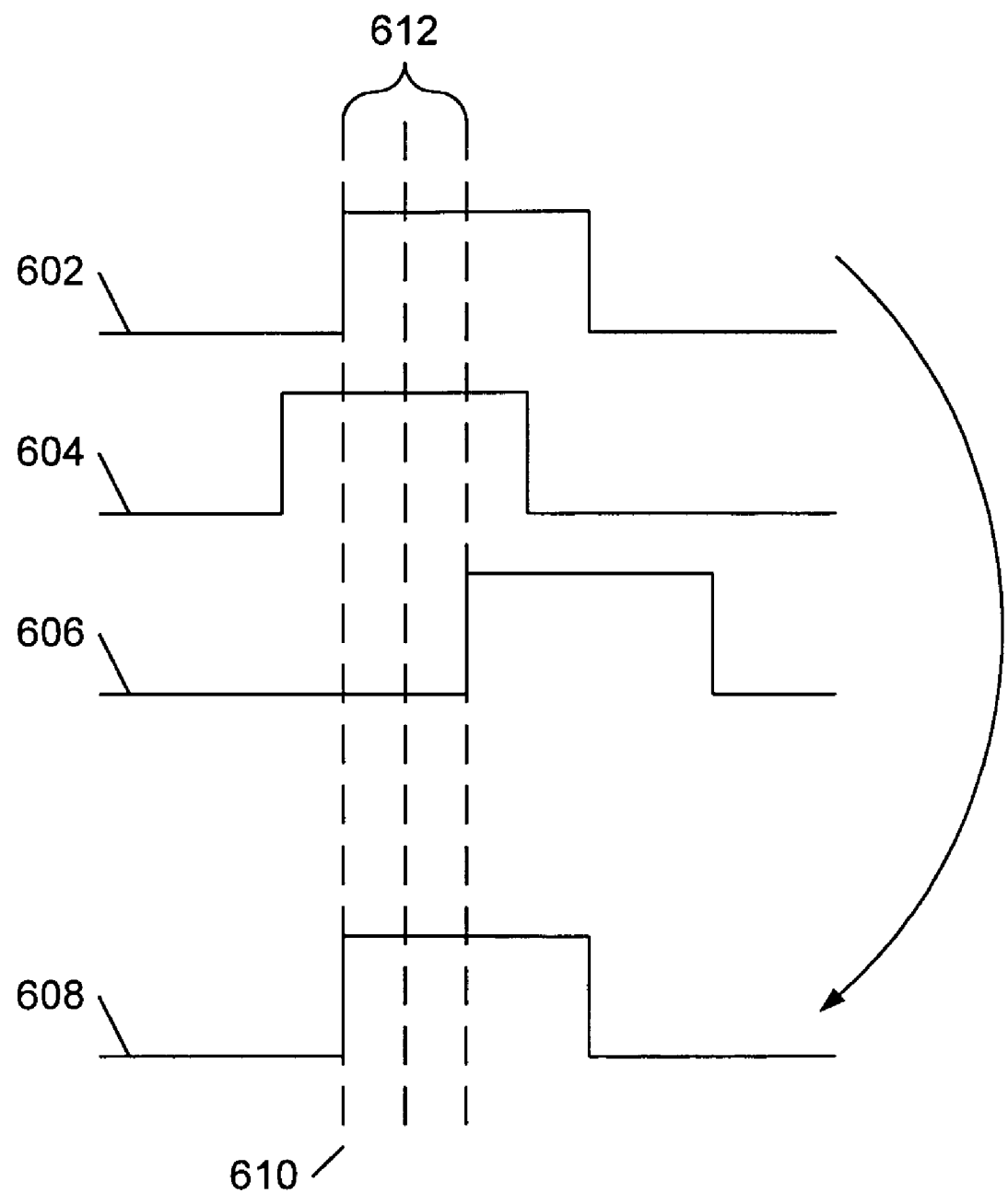
FIG. 6 illustrates an example of a timing diagram in which the early clock signal is selected as the output of the signal selector circuit, in accordance with an embodiment of the invention.

FIG. 6 illustrates an example of a timing diagram in which the early clock signal 602 is selected as the output 608 of the signal selector circuit, in accordance with an embodiment of the invention. This timing diagram depicts an example of the relative positions of the early clock signal 602, the external clock signal 604 (as delayed by element 408, FIG. 4), and the late clock signal 606. As the example illustrates, the edge of the external clock signal 604 occurs before the early boundary 610 of the jitter window 612. According to the decision logic represented in Table 1, above, this means that the early clock signal 602 is selected as the output signal 608 of the signal selector circuit 202 (FIG. 2).

Figure 7:
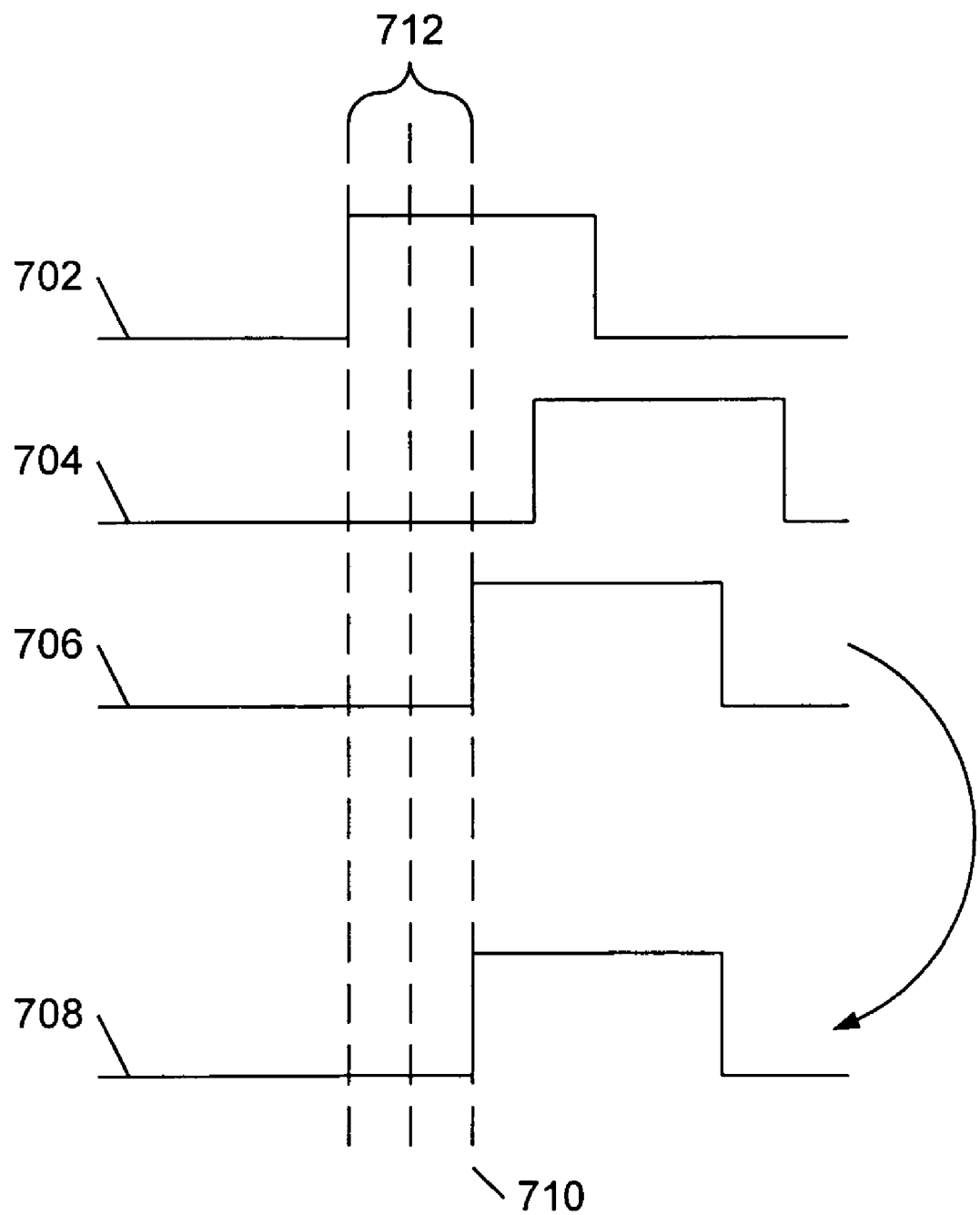
FIG. 7 illustrates an example of a timing diagram in which the late clock signal is selected as the output of the signal selector circuit, in accordance with an embodiment of the invention.

FIG. 7 illustrates an example of a timing diagram in which the late clock signal 706 is selected as the output 708 of the signal selector circuit, in accordance with an embodiment of the invention. This timing diagram depicts another example of the relative positions of the early clock signal 702, the external clock signal 704 (as delayed by element 408, FIG. 4), and the late clock signal 706. As the example illustrates, the edge of the external clock signal 704 occurs after the late boundary 710 of the jitter window 712. According to the decision logic represented in Table 1, above, this means that the late clock signal 706 is selected as the output signal 708 of the signal selector circuit 202 (FIG. 2).

Figure 8:
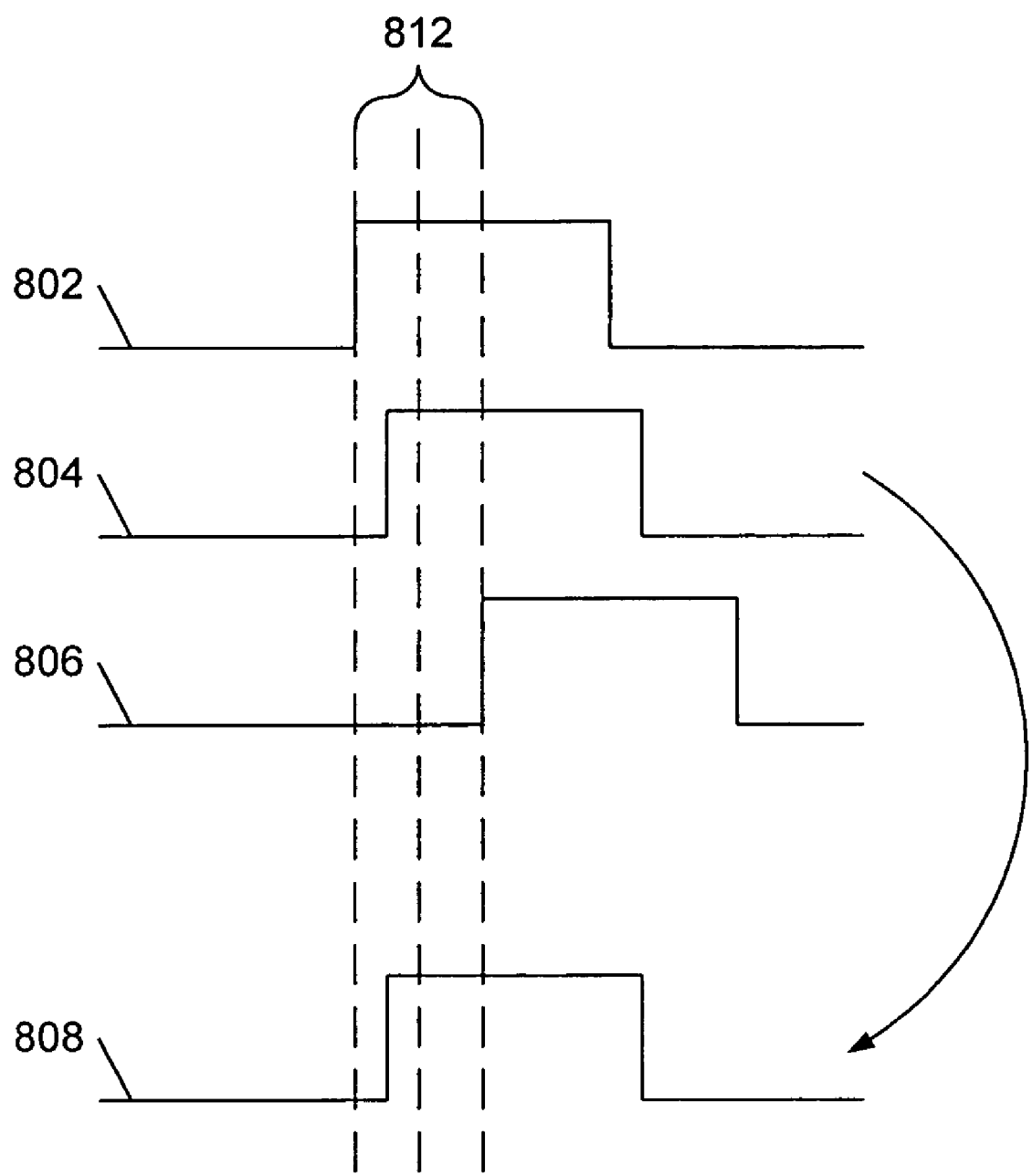
FIG. 8 illustrates an example of a timing diagram in which the external clock signal is selected as the output of the signal selector circuit, in accordance with an embodiment of the invention.

FIG. 8 illustrates an example of a timing diagram in which the external clock signal 804 is selected as the output 808 of the signal selector circuit, in accordance with an embodiment of the invention. This timing diagram depicts still another example of the relative positions of the early clock signal 802, the external clock signal 804 (as delayed by element 408, FIG. 4), and the late clock signal 806. As the example illustrates, the edge of the external clock signal 804 occurs within the jitter window 812. According to the decision logic represented in Table 1, above, this means that the external clock signal 804 is selected as the output signal 808 of the signal selector circuit 202 (FIG. 2).

In the embodiments described above, relatively abrupt transitions are made between the external clock signal (e.g., signal 422, FIG. 4) and the feedback signal (e.g., either the early or late clock signals 420, 424) in order to transition between DLL mode and PLL mode. A graded phase mixing technique between the external clock signal and the feedback signal is used, in an alternate embodiment, to transition between DLL and PLL modes. Using this technique, a smoother transition between modes can be achieved.

Figure 9:
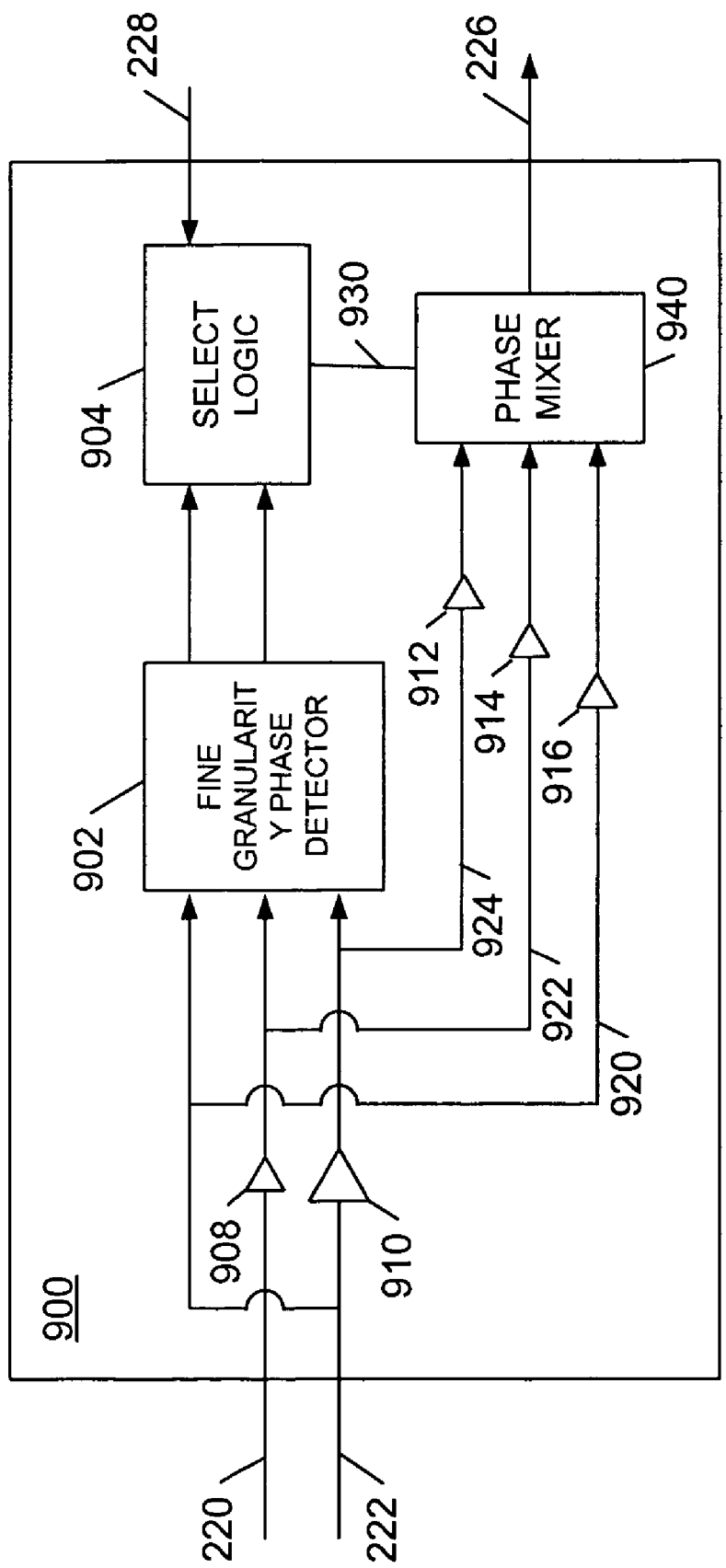
FIG. 9 illustrates a simplified block diagram of a signal selector circuit, which uses graded phase mixing, in accordance with another embodiment of the invention.

FIG. 9 illustrates a simplified block diagram of a signal selector circuit 900, which uses graded phase mixing to transition between DLL and PLL modes, in accordance with an alternate embodiment of the invention. The circuit of FIG. 9 is similar to the circuit of FIG. 4, in that the signal selector 900 includes a fine granularity phase detector 902, select logic 904, and various delay elements 908, 910, 912, 914, 916. The operation of these components is substantially the same as the operation of the corresponding components described in conjunction with FIG. 4.

Instead of using a multiplexer (e.g., multiplexer 406, FIG. 4), however, the signal selector circuit 900 includes phase mixer 940, in one embodiment. Phase mixer 940 receives three signal inputs, which correspond to the early clock signal, the delayed external clock signal, and the late clock signal, respectively. Phase mixer 940 further receives an input signal 930 from select logic 904, which indicates which signal phase mixer 940 should provide as the output signal 226.

In one embodiment, each of the three signals 920, 922, 924 is subject to a delay, via a set of delay elements 912, 914, 916, prior to being provided to phase mixer 940. This produces a first, second, and third mixer input signal. The amount of delay inserted by delay elements 912, 914, 916 is approximately the propagation delay of the signal selection process (i.e., blocks 902, 904), in one embodiment. The amount of delay is selected to increase the likelihood that mixer 940 will be properly set before the arrival of the delayed versions of signals 920, 922, 924, in one embodiments. In other embodiments, delay elements 912, 914, 916 are not included in the circuit, or the amount of inserted delay is larger or smaller than the signal selection process propagation delay.

When the control signal 930 from select logic 904 indicates a transition between DLL and PLL modes, in either direction, phase mixer 940 smoothly transition from the phase of the clock signal that it is currently providing to the output 226 to the phase of the clock signal that select logic 904 instructs it to now provide. In other words, phase mixer 940 smoothly transitions between providing the external clock signal or one or the other feedback signal. Using phase mixer 940, the granularity for delay can be reduced, and yet it can still be continuous from one coarse element to the next coarse element of the delay line.

Figure 10:
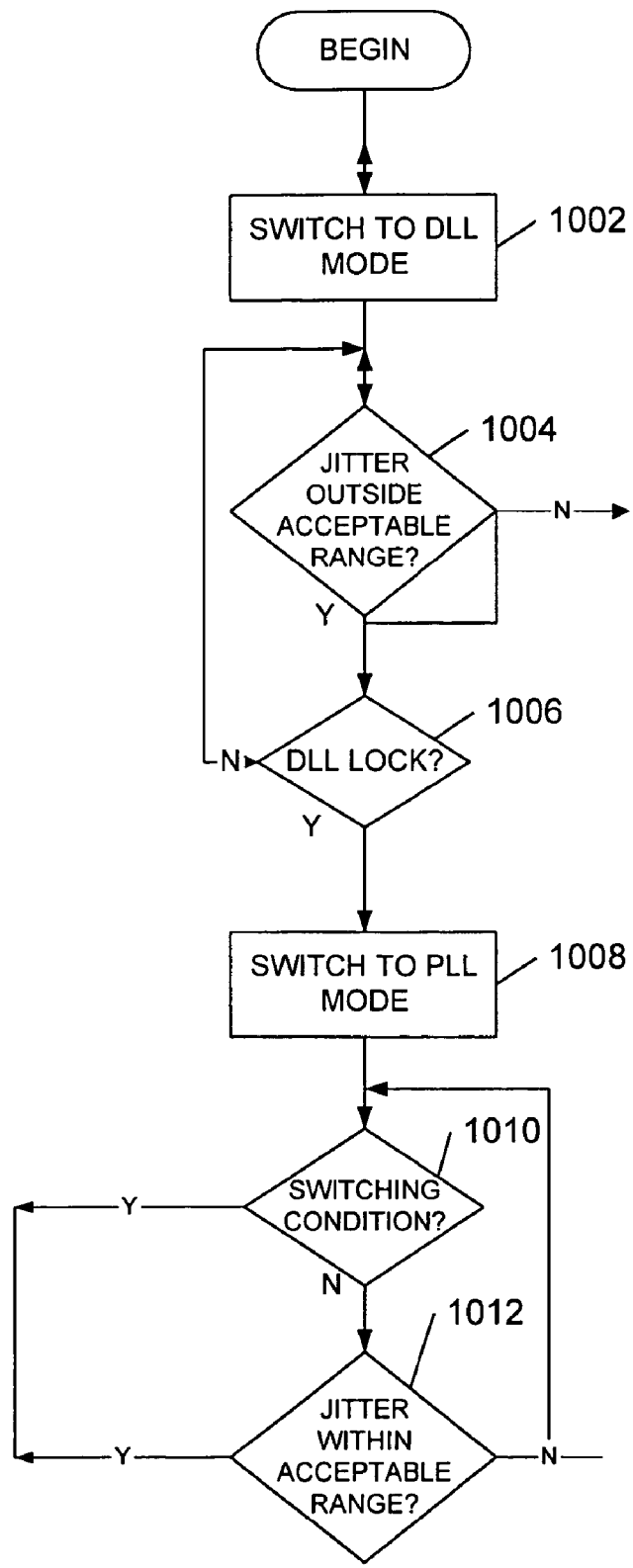
FIG. 10 illustrates a flowchart of a method for suppressing jitter in a clock signal, in accordance with an embodiment of the invention.

FIG. 10 illustrates a flowchart of a method for suppressing jitter in a clock signal, in accordance with an embodiment of the invention. In one embodiment, the method depicted in FIG. 10 is carried out by a clock synchronization circuit, such as the circuit 200 described in conjunction with FIG. 2. In other embodiments, all or portions of the method can be carried out in software, or by combinations of hardware elements that are different from those depicted in FIG. 2, but that function in a substantially similar way.

The method begins, in block 1002, by switching to DLL mode. Initially, when a startup procedure is implemented, this involves providing the external clock signal as the input to the circuit's delay line, and waiting for the circuit to achieve DLL lock. The external clock signal can be passed directly to the delay line, or can be subject to a delay before providing it to the delay line, in various embodiments.

Upon detection of an edge of the external clock signal, a determination is made, in block 1004, whether the external clock signal is experiencing jitter that falls outside an acceptable range of values. In one embodiment, this determination involves determining whether the a magnitude of the jitter is greater than a deviation threshold, td. In one embodiment, the rising edge of the external clock signal is used as the evaluation point. In another embodiment, the falling edge of the external clock signal is used.

The determination of block 1004 is made, in one embodiment, by a signal selector circuit (e.g., signal selector 202, FIG. 2), which emulates the boundaries of a jitter window based on a feedback signal (e.g., signal 222), and determines whether the clock edge occurs before, within, or after the jitter window. If the clock edge falls within the boundaries of the jitter window, then the jitter does not fall outside the acceptable range, and the method iterates as shown in FIG. 10 (i.e., it continues to repeat block 1004).

If the clock edge occurs before or after the boundaries of the jitter window, then the jitter is considered to fall outside the acceptable range, and a transition to PLL mode is initiated. This transition involves first determining, in block 1006, whether the DLL circuit is currently locked (i.e., the output signal is synchronized with the external signal). In one embodiment, this determination is made based on the phase difference between the external clock signal and the feedback signal. If the magnitude of the phase difference exceeds a particular value, which is greater than the deviation threshold, then the DLL circuit is not considered to be locked. Accordingly, the circuit does not switch to PLL mode, but instead remains in DLL mode by continuing to provide the external clock signal to the delay line, and repeating blocks 1004 and 1006.

If the DLL circuit is locked, as determined in block 1006, then the clock synchronization circuit is switched to a PLL mode, in block 1008. In one embodiment, this involves switching the input to the delay line from the external clock signal to a signal based on the feedback signal (e.g., signal 222). In one embodiment, one of two feedback signals can be chosen, as described in detail above, based on whether the edge of the external clock signal occurred before or after the boundaries of the jitter window. In an alternate embodiment, more or fewer than two feedback signals can be available to provide to the delay line.

After PLL mode operation is initiated, a determination is made whether a switching condition has occurred, in block 1010. In one embodiment, a switching condition is the expiration of a timeout period. The timeout period represents the maximum amount of time that the clock synchronization circuit is allowed to remain in PLL mode. In other embodiments, the switching condition can be some other condition, such as a determination that a phase difference between the external clock signal and the feedback clock signal is too large, or that a read failure has occurred, for example. Other switching conditions can be contemplated by those of skill in the art based on the description herein. If a switching condition has occurred, then the circuit switches back to DLL mode operations by returning to block 1002, and the procedure iterates.

If a switching condition has not occurred, a determination is made, in block 1012, whether the jitter converged back into the range of acceptable values. This determination is made in a manner similar to the determination made in block 1004. If the jitter falls outside the range, then the circuit remains in PLL mode, and the procedure iterates as shown. If the jitter has converged back into the acceptable range, then the circuit switches back to DLL mode operations by returning to block 1002, and the procedure iterates as shown.

Although FIG. 10 depicts a certain flow of operations, the various functional blocks can be differently arranged, some processes merged, and similar processes performed, while still performing the same overall function. Therefore, variations in the arrangement and blocks illustrated in FIG. 10 are contemplated to fall within the scope of the present invention.

Figure 11:
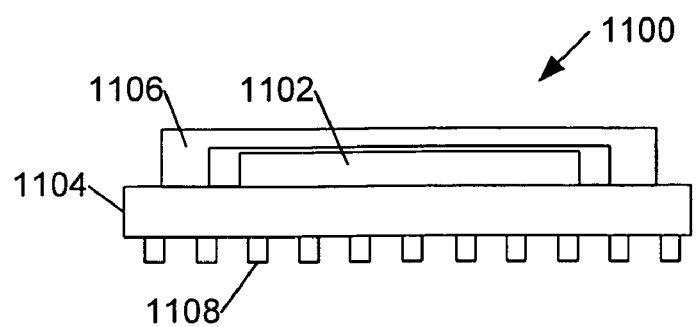
FIG. 11 illustrates an integrated circuit device, which incorporates a clock synchronization circuit, in accordance with an embodiment of the invention.

FIG. 11 illustrates an integrated circuit device 1100, which incorporates a clock synchronization circuit, in accordance with an embodiment of the invention. Device 1100 includes an integrated circuit 1102, packaging substrate 1104, cap 1106, and terminals 1108. Integrated circuit 1102 includes a clock synchronization circuit and/or performs a method of suppressing jitter in an input signal, in accordance with one or more of the various embodiments of the invention described above. Integrated circuit 1102 can be, for example a microprocessor, memory controller, memory device, application specific integrated circuit (ASIC), or one of many other types of integrated circuits that can benefit from incorporation of the embodiments of the invention.

Integrated circuit 1102 is mounted on and electrically interconnected with packaging substrate 1104, and encapsulated by cap 1106. The interconnections can be based on flip-chip, wirebond, or other interconnection technologies. Packaging substrate 1104 can be formed from organic or inorganic dielectric materials, and also includes one or more conductive layers and vias interconnecting the conductive layers. Packaging substrate 1104 acts as a vehicle for transferring signals, power, and ground between integrated circuit 1102 and terminals 1108. Terminals 1108 can be pins, lands or other conductive structures, which enable package 1104 to be electrically connected to a socket, interposer, PC board or other level of interconnect. Depending on the type of terminal employed, package 1104 can be permanently or removably connected to the other level of interconnect, using pin grid array, ball grid array, land grid array, or other interconnection technologies.

Figure 12:
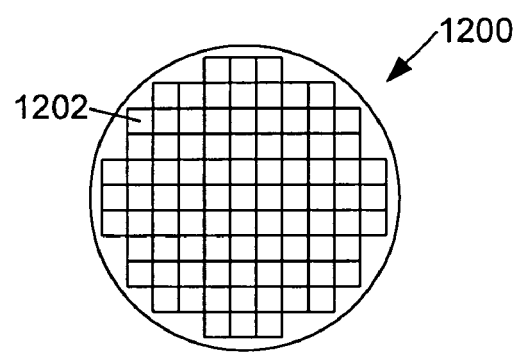
FIG. 12 illustrates a semiconductor wafer, which includes at least one integrated circuit with a clock synchronization circuit, in accordance with an embodiment of the invention.

FIG. 12 illustrates a wafer 1200, which includes multiple integrated circuits 1202, at least one of which incorporates a clock synchronization circuit, in accordance with an embodiment of the invention. In one embodiment, the wafer includes a semiconductor substrate, such as a silicon, germanium, gallium arsenide or indium phosphide wafer. In other embodiments, the substrate can be an insulator such as glass or aluminum, or a metal such as stainless steel or iron. After processing the substrate to form the various circuit elements of the clock synchronization circuit, and any other circuit elements included in the integrated circuit, each integrated circuit 1202 may be singulated into individual semiconductor die, packaged, and incorporated into an electronic system. When the wafer includes integrated memory circuits, the substrate also includes a plurality of memory cells supported by the substrate.

Figure 13:
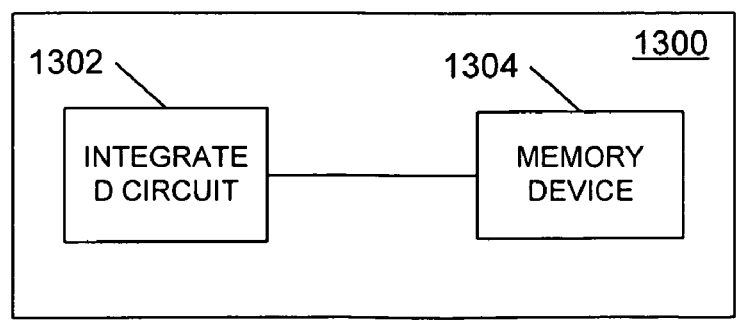
FIG. 13 illustrates an electronic system, which incorporates a clock synchronization circuit, in accordance with an embodiment of the invention.

The configurations described above in conjunction with various embodiments can form part of an electronic system. FIG. 13 illustrates a simplified block diagram of an electronic system 1300, which incorporates a clock synchronization circuit, in accordance with an embodiment of the present invention. The system shown in FIG. 13 can be, for example, a computer, a wireless or wired communication device (e.g., telephone, modem, cell phone, pager, radio, etc.), a television, a monitor or virtually any other type of electronic system that can benefit from the use of a clock synchronization circuit capable of suppressing jitter present in a input clock signal.

The electronic system includes one or more integrated circuits 1302 and one or more memory devices 1304. An integrated circuit 1302 can be connected with a memory device 1304 via one or more signal lines and/or busses, in various embodiments. The clock synchronization circuits and the methods of suppressing jitter of the various embodiments can be implemented in either or both the integrated circuits 1302 and the memory devices 1304. Integrated circuits 1302 can include, for example but not by way of limitation, a microprocessor, memory controller, ASIC, or virtually any other type of integrated circuit that can benefit from the embodiments of the present invention. Memory devices 1304 can include, for example but not by way of limitation, a synchronous memory device (e.g., a synchronous DRAM) or virtually any other type of memory device that can benefit from the embodiments of the present invention. In general, a device that incorporates one or more of the embodiments of the invention receives an external clock signal, which may be subject to jitter, and produces an internal clock signal using the apparatus and/or methods described above in conjunction with the various embodiments.

CONCLUSION

Various embodiments of a clock synchronization circuit and method for suppressing jitter in an input clock signal have been described, along with a description of the incorporation of the embodiments within an integrated circuit, substrate, and electronic system. The various embodiments provide improved performance of an integrated circuit, by enabling the output of a clock synchronization circuit to be less detrimentally affected by excessive jitter in an input clock signal.

Modifications that would be apparent to those of skill in the art can be made to the various embodiments to achieve the same results. In particular, the various elements of the clock synchronization circuit can be arranged differently from the illustrated embodiments, while achieving the same results. In addition, the functions performed by the signal selector circuit (e.g., signal selector 202, FIG. 2) can be carried out in other circuit elements, or can be carried out by circuit configurations that are different from the designs depicted in FIGS. 4, 5, and 9. Alternate embodiments for achieving substantially the same results in substantially the same way would be obvious to those of skill in the art based on the description herein.

Although the embodiments have been described in the context of an internal clock generator for a memory device, the embodiments also can be used in conjunction with an internal clock generator for a microprocessor, an ASIC, and numerous other systems or devices which operate in synchronization with an external clock signal. The circuit and methods of the various embodiments can be used in conjunction with any application for which a synchronized signal is generated based on an input clock signal that is subject to jitter.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method, comprising:
   producing a feedback clock signal from an internal clock signal;
   detecting a jitter between an external clock signal and the feedback clock signal;

switching, based on the jitter, between providing the external clock signal or the feedback clock signal as an input clock signal to a delay line; and
delaying the input clock signal within the delay line to produce the internal clock signal.

2. The method of claim 1, wherein producing comprises:
delaying the internal clock signal to produce the feedback clock signal.

3. The method of claim 1, wherein switching comprises:
delaying the external clock signal by a first delay to produce a delayed external clock signal;
delaying the feedback clock signal by a second delay to produce a late clock signal;
comparing the feedback clock signal, the delayed external clock signal, and the late clock signal;
producing a control signal based on a magnitude of a phase difference between the external clock signal and the feedback clock signal; and
providing the feedback clock signal, the delayed external clock signal or the late clock signal as the input clock signal, based on a value of the control signal.

4. The method of claim 1, wherein switching comprises:
delaying the external clock signal by a first delay to produce a delayed external clock signal;
delaying the feedback clock signal by a second delay to produce a late clock signal;
comparing the feedback clock signal, the delayed external clock signal, and the late clock signal;
producing a control signal based on a magnitude of a phase difference between the external clock signal and the feedback clock signal;
delaying the feedback clock signal, the delayed external clock signal, and the late clock signal, by an amount of delay that increases a likelihood that a multiplexer is properly set, resulting in a first multiplexer input signal, a second multiplexer input signal, and a third multiplexer input signal; and
providing, based on a value of the control signal, the first multiplexer input signal, the second multiplexer input signal or the third multiplexer input signal as the input clock signal.

5. The method of claim 1, wherein switching comprises:
delaying the external clock signal by a first delay to produce a delayed external clock signal;
delaying the feedback clock signal by a second delay to produce a late clock signal;
comparing the feedback clock signal, the delayed external clock signal, and the late clock signal;
producing a control signal based on a magnitude of a phase difference between the external clock signal and the feedback clock signal; and
transitioning between providing the feedback clock signal, the delayed external clock signal or the late clock signal as the input clock signal, based on a value of the control signal.

6. The method of claim 1, wherein switching comprises:
delaying the external clock signal by a first delay to produce a delayed external clock signal;
delaying the feedback clock signal by a second delay to produce a late clock signal;
comparing the feedback clock signal, the delayed external clock signal, and the late clock signal;
producing a control signal based on a magnitude of a phase difference between the external clock signal and the feedback clock signal;
delaying the feedback clock signal, the delayed external clock signal, and the late clock signal, by an amount of delay that increases a likelihood that a phase mixer is properly set, resulting in a first mixer input signal, a second mixer input signal, and a third mixer input signal; and
transitioning, based on a value of the control signal, between providing the first mixer input signal, the second mixer input signal or the third mixer input signal as the input clock signal.

7. The method of claim 1, further comprising:
determining a phase difference between the input clock signal and the feedback clock signal;
generating a control signal having a value that depends on the phase difference; and
providing, based on the control signal, a delay control signal to the delay line to control the delay line.

8. A method, comprising:
delaying, by a delay line, an input clock signal to generate an internal clock signal;
producing a feedback clock signal from the internal clock signal;
determining a phase difference between the input clock signal and the feedback clock signal;
producing a control signal according to the phase difference;
controlling a delay line based on the control signal; and
switching between a delay locked loop mode and a phase locked loop mode based on a detected jitter between the external clock signal and the feedback clock signal, wherein in the delay locked loop mode, an external clock signal is provided as the input clock signal to the delay line, and in the phase locked loop mode, the feedback clock signal is provided as the input clock signal to the delay line.

9. The method of claim 8, wherein switching comprises:
delaying the external clock signal by a first delay to produce a delayed external clock signal;
delaying the feedback clock signal by a second delay to produce a late clock signal; and
comparing the feedback clock signal, the delayed external clock signal, and the late clock signal to determine which of the feedback clock signal, the delayed external clock signal or the late clock signal to produce as the input clock signal.

10. The method of claim 8, wherein switching comprises:
delaying the external clock signal by a first delay to produce a delayed external clock signal;
delaying the feedback clock signal by a second delay to produce a late clock signal;
comparing the feedback clock signal, the delayed external clock signal, and the late clock signal; and
when an edge of the delayed external clock signal occurs after a corresponding edge of the feedback clock signal but before a corresponding edge of the late clock signal, outputting the delayed external clock signal as the input clock signal.

11. The method of claim 8, wherein switching comprises:
delaying the external clock signal by a first delay to produce a delayed external clock signal;
delaying the feedback clock signal by a second delay to produce a late clock signal;
comparing the feedback clock signal, the delayed external clock signal, and the late clock signal; and
when an edge of the delayed external clock signal occurs before a corresponding edge of the feedback clock signal, outputting the feedback clock signal as the input clock signal.

12. The method of claim 11, wherein outputting the feedback clock signal is performed when the external clock signal and the internal clock signal are synchronized.

13. The method of claim 8, wherein switching comprises:
 delaying the external clock signal by a first delay to produce a delayed external clock signal;
 delaying the feedback clock signal by a second delay to produce a late clock signal;
 comparing the feedback clock signal, the delayed external clock signal, and the late clock signal; and
 when an edge of the delayed external clock signal occurs after a corresponding edge of the late clock signal, outputting the late clock signal as the input clock signal.

14. The method of claim 13, wherein outputting the late clock signal is performed when the external clock signal and the internal clock signal are synchronized.

15. A method, comprising:
 detecting a jitter between an external clock signal and a second clock signal;
 switching, based on the jitter, between providing the external clock signal or the feedback clock signal as an input clock signal to a delay line; and
 delaying the input clock signal within the delay line to produce the internal clock signal.

16. The method of claim 15, further comprising:
 producing the second clock signal as a feedback clock signal derived from the internal clock signal.

17. The method of claim 16, wherein producing comprises:
 delaying the internal clock signal to produce the feedback clock signal.

18. The method of claim 16, further comprising:
 determining a phase difference between the input clock signal and the feedback clock signal;
 generating a control signal having a value that depends on the phase difference; and
 providing, based on the control signal, a delay control signal to the delay line to control the delay line.

19. An apparatus, comprising:
 a signal selector circuit to switch between providing an external clock signal or a second clock signal as an input clock signal to a delay line based on a detected jitter between the external clock signal and the second clock signal;
 the delay line, coupled to the signal selector circuit, to receive the input clock signal and to generate an internal clock signal; and
 a feedback loop, coupled between an output of the delay line and an input of the signal selector circuit, to produce the second clock signal from the internal clock signal.

20. The apparatus of claim 19, wherein the signal selector circuit comprises:
 a first delay element, which delays the external clock signal by a first delay to produce a delayed external clock signal;
 a second delay element, which delays the second clock signal by a second delay to produce a late clock signal;
 a phase detector, which receives and compares the second clock signal, the delayed external clock signal, and the late clock signal to produce a control signal based on a magnitude of a phase difference between the external clock signal and the second clock signal; and
 a multiplexer, which provides the second clock signal, the delayed external clock signal or the late clock signal as the input clock signal, based on a value of the control signal.

21. The apparatus of claim 19, wherein the signal selector circuit comprises:
 a first delay element, which delays the external clock signal by a first delay to produce a delayed external clock signal;
 a second delay element, which delay the second clock signal by a second delay to produce a late clock signal;
 a phase detector, which receives and compares the second clock signal, the delayed external clock signal, and the late clock signal to produce a control signal based on a magnitude of a phase difference between the external clock signal and the second clock signal;
 a set of delay elements for delaying the second clock signal, the delayed external clock signal, and the late clock signal, by an amount of delay that increases a likelihood that a multiplexer is properly set, resulting in a first multiplexer input signal, a second multiplexer input signal, and a third multiplexer input signal; and
 the multiplexer, which provides, based on a value of the control signal, the first multiplexer input signal, the second multiplexer input signal or the third multiplexer input signal as the input clock signal.

22. An apparatus, comprising:
 a signal selector circuit to switch between providing an external clock signal or a feedback clock signal as an input clock signal to a delay line based on a detected jitter between the external clock signal and the feedback clock signal;
 the delay line, coupled to the signal selector circuit, to receive the input clock signal and to generate an internal clock signal; and
 a feedback loop, coupled between an output of the delay line and an input of the signal selector circuit, to produce the feedback clock signal from the internal clock signal.

23. The apparatus of claim 22, wherein the signal selector circuit comprises:
 a first delay element, which delays the external clock signal by a first delay to produce a delayed external clock signal;
 a second delay element, which delays the feedback clock signal by a second delay to produce a late clock signal;
 a phase detector, which receives and compares the feedback clock signal, the delayed external clock signal, and the late clock signal to produce a control signal based on a magnitude of a phase difference between the external clock signal and the feedback clock signal; and
 a multiplexer, which provides the feedback clock signal, the delayed external clock signal or the late clock signal as the input clock signal, based on a value of the control signal.

24. The apparatus of claim 22, wherein the signal selector circuit comprises:
 a first delay element, which delays the external clock signal by a first delay to produce a delayed external clock signal;
 a second delay element, which delay the feedback clock signal by a second delay to produce a late clock signal;
 a phase detector, which receives and compares the feedback clock signal, the delayed external clock signal, and the late clock signal to produce a control signal based on a magnitude of a phase difference between the external clock signal and the feedback clock signal;

a set of delay elements for delaying the feedback clock signal, the delayed external clock signal, and the late clock signal, by an amount of delay that increases a likelihood that a multiplexer is properly set, resulting in a first multiplexer input signal, a second multiplexer input signal, and a third multiplexer input signal; and the multiplexer, which provides, based on a value of the control signal, the first multiplexer input signal, the second multiplexer input signal or the third multiplexer input signal as the input clock signal.

* * * * *